(12) United States Patent
Nuttall et al.

(10) Patent No.: US 7,193,273 B2
(45) Date of Patent: Mar. 20, 2007

(54) METHOD FOR ENHANCING VERTICAL GROWTH DURING THE SELECTIVE FORMATION OF SILICON, AND STRUCTURES FORMED USING SAME

(75) Inventors: Michael Nuttall, Meridian, ID (US); Garry Anthony Mercaldi, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/075,640

(22) Filed: Feb. 13, 2002

(65) Prior Publication Data

US 2002/0100905 A1    Aug. 1, 2002

Related U.S. Application Data

(62) Division of application No. 09/770,909, filed on Jan. 26, 2001, now Pat. No. 6,680,229.

(51) Int. Cl.
*H01L 27/01* (2006.01)

(52) U.S. Cl. .......................................... 257/353; 438/41

(58) Field of Classification Search ........ 438/253–255, 438/396–398, 39, 41, 226, 442, 478, 489; 257/353, 354, 623, E21.09, E21.092, E21.132, 257/E21.134, E21.461, E21.562, E21.571
See application file for complete search history.

(56) References Cited

U.S. PATENT DOCUMENTS

| 4,686,758 A | 8/1987 | Liu et al. ....................... 437/34 |
| 4,952,526 A | 8/1990 | Pribat et al. ................... 437/89 |
| 5,038,183 A | 8/1991 | Kishi et al. .................... 357/13 |
| 5,096,740 A | 3/1992 | Nakagama et al. ......... 427/53.1 |
| 5,276,343 A | 1/1994 | Kumagai et al. ........... 257/306 |
| 5,422,299 A | 6/1995 | Neudeck et al. .............. 437/63 |

(Continued)

OTHER PUBLICATIONS

Boman, M. et al., "Helical Microsturcture Grown by Laser Assisted Chemical Vapour Deposition", Micro Electro Mechanical Systems, Feb. 4-7, 1992, pp. 162-167.

(Continued)

*Primary Examiner*—David Vu
(74) *Attorney, Agent, or Firm*—Dorsey & Whitney, LLP

(57) ABSTRACT

A method of selectively forming contact regions on a substrate having a plurality of exposed regions includes selectively forming a contact region on each of the exposed regions of the substrate. During formation, each contact region has a first growth rate in a first direction and a second growth rate in a second direction. While each contact region is being selectively formed on the respective exposed region, the contact region is heated to increase the first growth rate of the contact region in the first direction relative to the second growth rate of the contact region in the second direction. The first growth rate may be a vertical growth rate and the second growth rate may be a lateral growth rate. The contact may be heated by applying electromagnetic radiation to an upper surface of the substrate and not applying the radiation to the vertical portions of the contact region to thereby increase the vertical growth rate relative to the lateral growth rate. The electromagnetic radiation may be collimated light such as that generated by a scanning laser beam, and the substrate and formed contact regions may be silicon or other suitable materials. This method may be used during the fabrication of MOS transistors in memory devices and other integrated circuits.

9 Claims, 2 Drawing Sheets

U.S. PATENT DOCUMENTS

| | | | | |
|---|---|---|---|---|
| 5,425,808 | A | | 6/1995 | Tokunaga et al. ............ 117/95 |
| 5,766,994 | A | * | 6/1998 | Tseng ......................... 438/254 |
| 5,776,621 | A | | 7/1998 | Nashimoto ................. 428/688 |
| 5,854,105 | A | * | 12/1998 | Tseng ......................... 438/253 |
| 6,001,709 | A | * | 12/1999 | Chuang et al. ............. 438/440 |
| 6,130,102 | A | * | 10/2000 | White et al. .................... 438/3 |
| 6,137,130 | A | * | 10/2000 | Sung ........................... 257/306 |
| 6,172,454 | B1 | | 1/2001 | Hofmann .................... 313/495 |
| 6,204,137 | B1 | * | 3/2001 | Teo et al. .................... 438/305 |
| 6,362,510 | B1 | * | 3/2002 | Gardner et al. ............. 257/374 |
| 6,593,174 | B2 | * | 7/2003 | Blanchard ................... 438/151 |

OTHER PUBLICATIONS

Wallenberger, F.T., "Rapid Prototyping Directly from the Vapor Phase (Laser-assisted Chemical Vapor Deposition)", American Association for the Advancement of Science, Mar. 3, 1995, pp. 1-5.

Westberg, H. et al., "Truly Three Dimensional Structures Microfabricated by Laser Chemical Processing", IEEE, 1991, pp. 516-519.

Philips Research Laboratories, N.V. Philips Gloeilampenfabrieken, Eindhoven, "Selective Epitaxial Deposition of Silicon", Nature No. 4840, Aug. 4, 1962, pp. 485-486.

Rai-Choudhury P. et al., "Selective Growth of Epitaxial Silicon and Gallium Arsenide", Westinghouse Research Laboratories, Pittsburgh, Pennsylvania, Jan. 1971, pp. 107-110.

Siekkinen J. W. et al., "SEG/ELO Material Characterization Using Silicon Bipolar Transistors", IEEE Bipolar Circuits & Technology Meeting, Sep. 12-13, 1988, pp. 237-240.

Siekkinen J.W. et al., "Selective Epitaxial Growth Silicon Bipolar Transistors for Material Characterization", IEEE Transactions on Electron Devices, vol. 35, No. 10, Oct. 1988, pp. 1640-1644.

* cited by examiner

US 7,193,273 B2

METHOD FOR ENHANCING VERTICAL GROWTH DURING THE SELECTIVE FORMATION OF SILICON, AND STRUCTURES FORMED USING SAME

CROSS-REFERENCE TO RELATED APPLICATION

This application is a divisional of U.S. patent application Ser. No. 09/770,909, filed Jan. 26, 2001, now U.S. Pat. No. 6,680,229.

TECHNICAL FIELD

The present invention is related generally to semiconductor processing, and more particularly to the selective formation of silicon during manufacture of a semiconductor device.

BACKGROUND OF THE INVENTION

During the formation of semiconductor integrated circuits, devices are formed in a semiconductor substrate and interconnected to form a circuit that performs a desired function, such as a microprocessor for processing data or a memory device for storing data. To interconnect the millions of components contained in many integrated circuits, connections or "contacts" to each device are formed using conductive materials such as metal and polysilicon, as will be appreciated by those skilled in the art.

FIG. 1 is a diagram illustrating several silicon contacts 100, 102, 104 that have been selectively formed on a silicon substrate 106 using a conventional selective deposition method, such as selective epitaxial growth ("SEG"). In an ideal SEG process, the contacts 100–104 are selectively formed only on exposed regions 108–112 of the substrate 106, respectively, and are not formed on other exposed regions of the substrate such as the surfaces of isolation oxide regions 114 and 116. Each of the regions 108–112 typically includes a device (not shown), such as a metal oxide semiconductor ("MOS") transistor or diode, and the corresponding contact 100–104 is formed on the region to provide contact to the device. Although the contacts 100–104 and substrate 106 are described as being silicon in the example of FIG. 1, the general concepts being discussed apply to other materials as well, as will be understood by those skilled in the art.

FIG. 1 illustrates a potential problem that arises when selectively forming the silicon contacts 100–104 due to the horizontal or lateral growth 118 of the contacts in the direction indicated by the arrows. In an ideal SEG process, the contacts 100–102 are formed only through vertical growth 120 in the direction indicated by the arrow, and in this way the contacts form only on the exposed regions 108–112 of the substrate 106 and not on the isolation oxide regions 114, 116. Due to the lateral growth 118, however, the contacts 100–104 grow towards each other and over the isolation oxide regions 114, 116. As illustrated for the contact 102, the lateral growth 118 results from silicon being deposited on an upper surface 122 while also being deposited on sidewalls 124, 126 of the contact during formation, as will be understood by those skilled in the art. The contact 102 grows in both the vertical and lateral directions at the same rate.

The lateral growth 118 may result in adjacent contacts undesirably touching each other, as indicated by the dotted lines 122 between the contacts 100 and 102. When the contacts 100 and 102 touch, an unwanted short circuit occurs and the devices being fabricated may not operate properly. As the size of devices being formed in integrated circuits continues to decrease, the distance between adjacent contacts 100, 102 and 102, 104 also decreases, making lateral growth 118 a concern since less lateral growth is required before adjacent contacts short circuit. While the amount of lateral growth of the contacts 100–104 can be reduced by forming the contacts for a shorter period of time, this is not a viable in most applications because the contacts must be formed to a desired height H, as indicated for the contact 100. As will be appreciated by those skilled in the art, the contacts 100–104 must reach the desired height H, for example, in order to ensure subsequent layers (not shown) can reliably connect to the contacts to provide electrical connection to the underlying devices. For example, in a MOS transistor it is desirable that contacts being formed to source and drain regions of the transistor are at least as high as a gate stack formed over a channel region of the transistor to ensure subsequent layers form proper connection to the contacts.

There is a need for a method of selectively forming silicon contacts of desired heights in integrated circuits having reduced device sizes.

SUMMARY OF THE INVENTION

According to one aspect of the present invention, a method of selectively forming contact regions on a substrate having a plurality of exposed regions includes selectively forming a contact region on each of the exposed regions of the substrate. During formation, each contact region has a first growth rate in a first direction and a second growth rate in a second direction. While each contact region is being selectively formed on the respective exposed region, the contact region is heated to increase the first growth rate of the contact region in the first direction relative to the second growth rate of the contact region in the second direction. The first growth rate may be a vertical growth rate and the second growth rate may be a lateral growth rate. The contact may be heated by applying electromagnetic radiation to an upper surface of the substrate and not applying the radiation to the vertical portions of the contact region to thereby increase the vertical growth rate relative to the lateral growth rate. The electromagnetic radiation may be collimated light such as that generated by a scanning laser beam, and the substrate and formed contact regions may be silicon or other suitable materials. This method may be used during the fabrication of MOS transistors in memory devices and other integrated circuits.

DETAILED DESCRIPTION OF THE INVENTION

Figure 2:
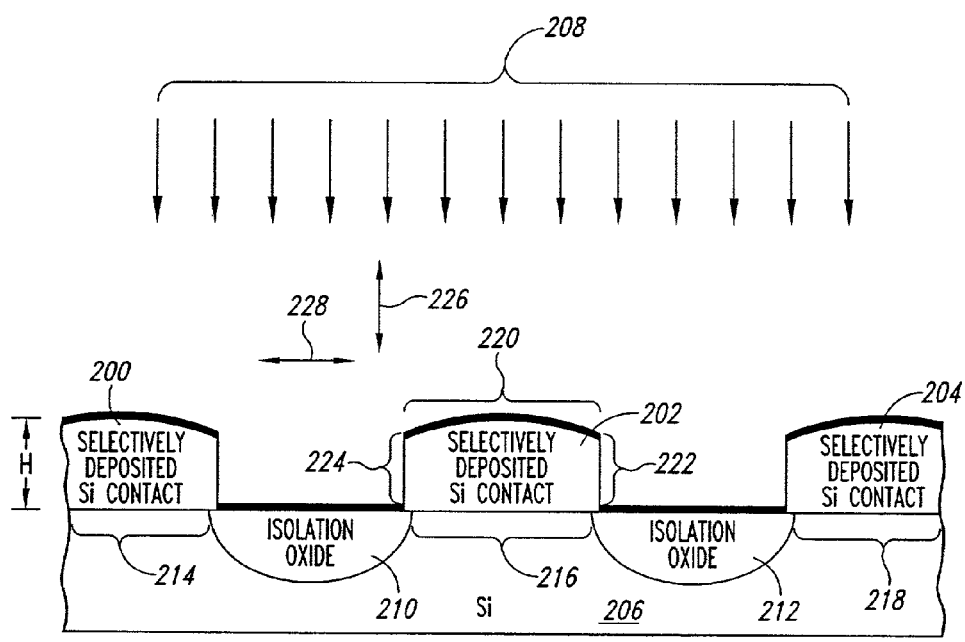
FIG. 2 is a diagram illustrating a method for selectively forming silicon contacts on a semiconductor substrate according to one embodiment of the present invention.

FIG. 2 is a diagram illustrating a method for selectively forming silicon contacts 200, 202, 204 on a semiconductor substrate 206 according to one embodiment of the present invention. In the method, collimated electromagnetic radiation 208 is applied to illuminate the contacts 200–204 during their formation and reduce the lateral growth of the contacts by increasing a vertical growth rate of the contacts relative to a lateral growth rate, as will be described in more detail below. Certain details are set forth below to provide a sufficient understanding of the invention. However, it will be clear to one skilled in the art that the invention may be practiced without these particular details. In other instances, well-known processes, materials, and device details have not been shown in detail in order to avoid unnecessarily obscuring the invention, but are well within the understanding of those skilled in the art.

The semiconductor substrate 206 includes isolation oxide regions 210 and 212 formed between the contacts 200, 202 and the contacts 202, 204, respectively. Each of the contacts 200–204 is formed over an exposed region 214–218, respectively, of the substrate 206, with each of these regions including a device (not shown), such as a MOS transistor, formed in the substrate within the region. Each of the contacts 200–204 is formed according to a selective deposition process so that the contacts are formed on the exposed regions 214–218 of the substrate 206, and are not formed on the exposed isolation oxide regions 210 and 212.

The selective deposition of the silicon contacts 200–204 is typically accomplished through a selective epitaxial growth ("SEG") process, but other selective deposition processes may also be utilized. As will be appreciated by those skilled in the art, during the SEG process, the substrate 206 is exposed to a source of silicon, such as silicon tetrachloride $SiCl_4$, silane $SiH_4$, or dichlorosilane $SiH_2Cl_2$, which provides the silicon that is deposited to form the contacts 200–204. To make the SEG deposition process selective, chlorine Cl or other suitable compound is present during the formation of the contacts to prevent deposition of the silicon on the isolation oxide regions 210, 212 and any other exposed regions except for the exposed regions 214–218 of the substrate 206. In some situations, the exposed regions 214–218 of the substrate 206 may be openings in an oxide layer formed on the substrate.

During the selective formation of the contacts 200–204, the collimated electromagnetic radiation 208 is applied to the contacts to heat the horizontal upper surfaces of the contacts, as will be now described in more detail with reference to the contact 202. The contact 202 includes an upper surface 220 that is substantially horizontal or parallel to the upper surface on the silicon substrate 206, and further includes two sidewall surfaces 222 and 224 that are substantially vertical or perpendicular to the upper surface of the silicon substrate. The collimated electromagnetic radiation 208 has a direction of propagation, as indicated by the arrows, which is substantially perpendicular to the surface of the semiconductor substrate 206 and the upper surface 220. A scanning laser or other suitable source may be utilized to generate the collimated electromagnetic radiation 208, and although the radiation is described as being electromagnetic radiation, any directional radiation source that can heat the upper surface 220 by a relatively large amount compared to the sidewall surfaces 222, 224 can be utilized, as will be discussed in more detail below.

Because the direction of propagation of the collimated electromagnetic radiation 208 incident on the upper surface 220 is substantially perpendicular to the upper surface, the intensity of the radiation incident upon the upper surface is relatively great, and thus the upper surface is heated by a relatively large amount due to the relatively high intensity of the applied electromagnetic radiation. As will be understood by those skilled in the art, the increased temperature of the upper surface 220 results in the deposition of more silicon on the upper surface. Thus, the increased temperature of the upper surface 220 due to the incident radiation 208 increases a vertical growth rate 226 of the contact 202 in the vertical direction indicated by the arrows. At the same time, the intensity of the radiation 208 incident upon the sidewall surfaces 222, 224 is relatively small compared to the intensity incident upon the upper surface 220. This is true because the sidewall surfaces 222, 224 are substantially vertical relative to the upper surface 220 and thus substantially parallel to the applied collimated electromagnetic radiation 208. As a result, a relatively small portion of the applied collimated electromagnetic radiation 208 is incident upon the sidewall surfaces 222, 224, and thus the surfaces are not significantly heated by the applied radiation. The sidewall surfaces 222, 224 are thus at a lower temperature relative to the upper surface 220. The lower temperature of the sidewall surfaces 222, 224 results in a lateral growth rate 228 in the horizontal direction as indicated by the arrows that is relatively small compared to the vertical growth rate 226.

Figure 1:
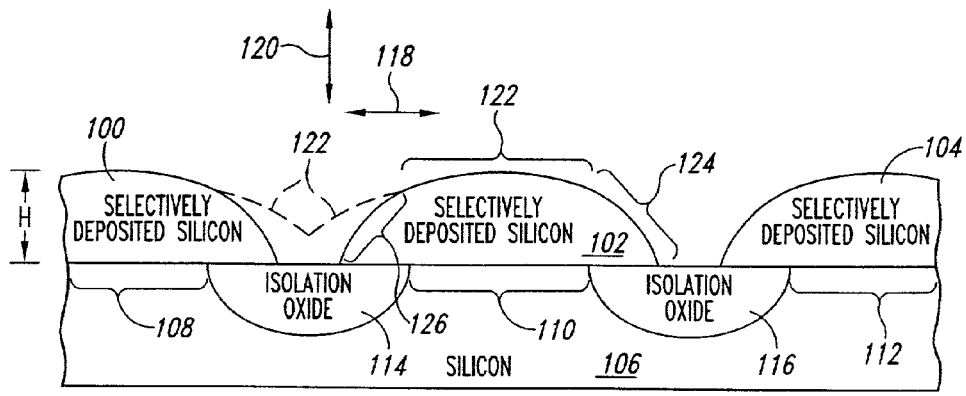
FIG. 1 is a diagram illustrating silicon contacts formed on a semiconductor substrate using a conventional selective deposition method.

In operation of the overall process of selectively forming the contacts 200–204 illustrated in FIG. 2, the substrate 206 is initially processed in preparation for forming the contacts, as will be appreciated by those skilled in the art. The SEG process is then started and the contacts 200–204 begin forming over the regions 214–218, respectively. At the same time, the radiation 208 is applied to begin heating the upper surfaces 222 of the contacts 200–204. The radiation 208 need not be applied coincident with the SEG process, but may start before or after the process starts. The radiation 208 heats the upper surfaces 220, causing the vertical growth rate 226 to increase relative to the lateral growth rate 228, which does not increase significantly because the intensity of the radiation on the sidewall surfaces 222, 224 is small relative to the intensity on the upper surfaces. As a result, the contacts 200–204 grow at a faster rate in the vertical direction 226 than in the lateral direction 228. The relatively smaller lateral growth rate 228 results in less lateral growth of each contact 200- 204 during the time the contact is being formed. As a result, the sidewall surfaces 222, 224 are more vertical than the sidewalls of contacts formed according to the conventional process previously discussed with reference to FIG. 1.

The reduced lateral growth rate 228 relative to the increased vertical growth rate 226 enables contacts 200–204 to be selectively formed having a desired height H in semiconductor integrated circuits having reduced lateral spacing between devices. As seen in the example of FIG. 2, the reduced lateral growth of the contacts 200 and 202 results in the contacts being formed only slightly over the isolation oxide region 210, while the increased vertical growth rate 226 enables the contacts to be grown to the desired height H. In FIG. 2, the surfaces that are significantly heated by the applied radiation 208 are indicated via the thicker lines and are seen to include the top surfaces of the isolation oxide regions 210 and 212 in addition to the upper surfaces 220. It should be noted that only the upper surfaces 220 of the contacts 200–204 are heated by the applied radiation 208 so that any dopants contained in the regions of devices underlying the contacts do not diffuse due to the heat. Such diffusion could destroy shallow junction devices, as will be appreciated by those skilled in the art. Although the example of FIG. 2 includes silicon contacts 200–204 and a silicon substrate 206, other materials such as gallium arsenide GaAs and silicon germanium SiGe may also be utilized, as will be appreciated by those skilled in the art.

Figure 3:
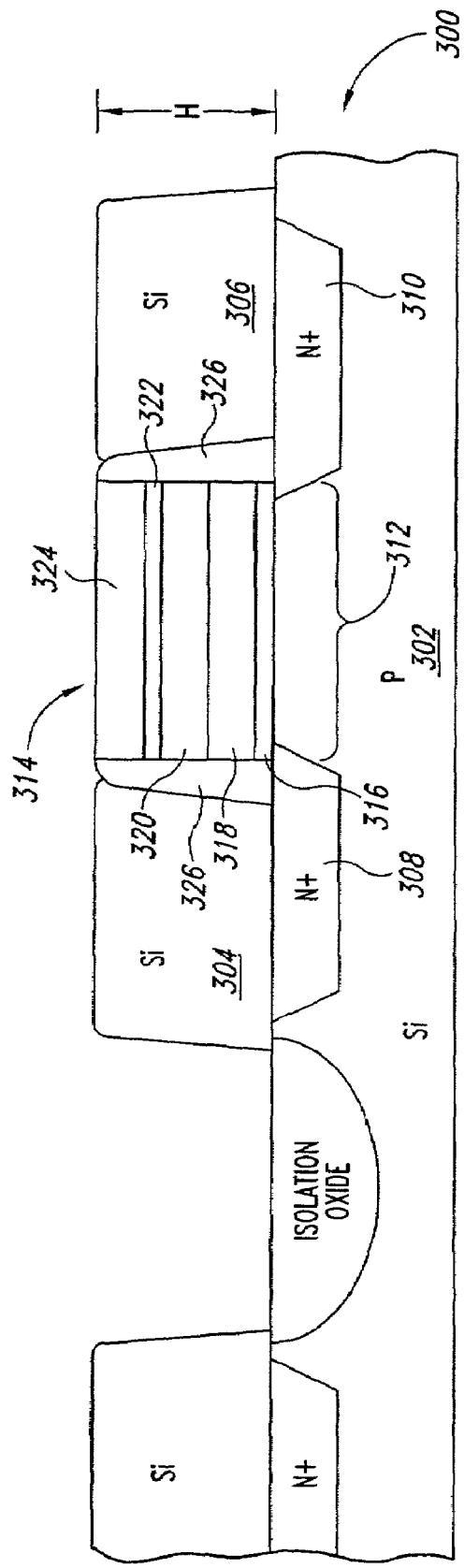
FIG. 3 is a diagram illustrating a MOS transistor including contact formed using the method of FIG. 2.

FIG. 3 is a diagram illustrating a MOS transistor 300 formed in a semiconductor substrate 302, the MOS transistor including contacts 304, 306 formed according to the method of FIG. 2. In the example of FIG. 3, the MOS transistor is an NMOS device including an N+ source region 308 and N+ drain region 310, with a P-type channel 312 being defined between the source and drain regions. A gate stack 314 is formed on the substrate 302 over the channel region 312. The gate stack includes an oxide layer 316, polysilicon layer 318, silicide layer 320, oxide layer 322, and nitride passivation layer 324 formed as shown. The layers 316–324 in the gate stack 314 result in the stack having a height H, and the contacts 304, 306 are formed having at least the height H to enable reliable connection to the contacts via subsequently formed layers. An insulating spacer layer 326, such as a silicon nitride or silicon oxide layer, is disposed on both sides of the gate stack 314 between the gate stack and the contacts 304, 306 to isolate the conductive layers in the stack from the contacts. In operation, a gate voltage is applied to the polysilicon layer 318 to induce a channel in the channel region 312, causing current to flow through the contact 306, through the drain region 310 and through the channel region to the source region 308, and through the source region to the contact 304, as will be appreciated by those skilled in the art.

It is to be understood that even though various embodiments and advantages of the present invention have been set forth in the foregoing description, the above disclosure is illustrative only, and changes may be made in detail, and yet remain within the broad principles of the invention. For example, many of the components described above may be implemented using different materials and different conductivity types. Therefore, the present invention is to be limited only by the appended claims.

The invention claimed is:

1. An in-process substrate structure including a plurality of contact regions and a plurality of non-contact regions adjacent the contact regions on a surface of a substrate, the in-process substrate structure comprising:
a selectively formed single crystal contact on each contact region, each single crystal contact being isolated from single crystal contacts on adjacent contact regions, each single crystal contact having an arcuate, convex upper surface intersected by two sidewall surfaces, the two sidewall surfaces being substantially perpendicular to the surface of the substrate, substantially all of the surface area of each of the two sidewall surfaces does not contact a structure of the in-process substrate structure.

2. The in-process substrate structure of claim 1 wherein the non-contact regions adjacent to the contact region comprise isolation oxide regions.

3. The in-process substrate structure of claim 1 wherein the substrate comprises silicon.

4. The in-process substrate structure of claim 1 wherein the substrate comprises gallium arsenide.

5. The in-process substrate structure of claim 1 wherein the substrate comprises silicon germanium.

6. The in-process substrate structure of claim 1 wherein the single crystal contact comprises silicon.

7. The in-process substrate structure of claim 1 wherein the single crystal contact comprises gallium arsenide.

8. The in-process substrate structure of claim 1 wherein the single crystal contact comprises silicon germanium.

9. The in-process substrate structure of claim 1 wherein the selectively formed single crystal contact extends past the contact region and over only a peripheral region of one of the adjacent non-contact regions.

* * * * *